(12) United States Patent
Einav

(10) Patent No.: US 11,437,535 B2
(45) Date of Patent: Sep. 6, 2022

(54) VOLTAGE-MATCHED MULTI-JUNCTION SOLAR MODULE MADE OF 2D MATERIALS

(71) Applicant: Moshe Einav, Kfar Uriya (IL)

(72) Inventor: Moshe Einav, Kfar Uriya (IL)

(*) Notice: Subject to any disclaimer, the term of this patent is extended or adjusted under 35 U.S.C. 154(b) by 54 days.

(21) Appl. No.: 16/962,547

(22) PCT Filed: Jan. 23, 2019

(86) PCT No.: PCT/IB2019/050558
§ 371 (c)(1),
(2) Date: Jul. 16, 2020

(87) PCT Pub. No.: WO2019/145867
PCT Pub. Date: Aug. 1, 2019

(65) Prior Publication Data
US 2020/0411709 A1    Dec. 31, 2020

Related U.S. Application Data

(60) Provisional application No. 62/620,519, filed on Jan. 23, 2018.

(51) Int. Cl.
| | |
|---|---|
| *H01L 31/0463* | (2014.01) |
| *H01L 31/043* | (2014.01) |
| *H01L 31/0475* | (2014.01) |
| *H01L 31/0725* | (2012.01) |
| *H01L 31/18* | (2006.01) |

(52) U.S. Cl.
CPC ........ *H01L 31/0463* (2014.12); *H01L 31/043* (2014.12); *H01L 31/0475* (2014.12); *H01L 31/0725* (2013.01); *H01L 31/18* (2013.01)

(58) Field of Classification Search
None
See application file for complete search history.

(56) References Cited

U.S. PATENT DOCUMENTS

| | | | |
|---|---|---|---|
| 4,289,920 A | 9/1981 | Hovel | |
| 5,019,177 A | 5/1991 | Wanlass | |
| 2005/0056312 A1* | 3/2005 | Young | H01L 31/18 |
| | | | 136/258 |

(Continued)

OTHER PUBLICATIONS

Jariwala et al., ACS Photonics, 2017, 4, 12, 2962-2970. (Year: 2017).*

(Continued)

*Primary Examiner* — Eli S Mekhlin
(74) *Attorney, Agent, or Firm* — Mark M. Friedman

(57) ABSTRACT

A voltage-matched solar module for converting incident solar radiation into electricity consisting of a plurality of wafer-sized multi-junction solar devices and wiring circuitry adjacent to a module-sized bottom substrate. Each solar device has at least two photovoltaic (PV) cells separated by electrically insulating transparent layers. The PV cells are aligned so as to overlap and are electrically connected to the wiring circuitry by conducting vias. The wiring circuitry includes a multiplicity of serial strings electrically connected in parallel and having substantially the same voltage. A method of producing the solar module is disclosed which utilizes an ALD/LPCVD tool for van der Waals epitaxy of 2D materials.

10 Claims, 12 Drawing Sheets

(56) References Cited

U.S. PATENT DOCUMENTS

2007/0137698 A1\* 6/2007 Wanlass ............... H01L 31/042
                                                                136/262
2008/0108171 A1   5/2008 Rogers et al.
2015/0340528 A1  11/2015 Alberi et al.

OTHER PUBLICATIONS

Bao et al., Electron. Mater. Lett., vol. 12, No. 1, (2016), pp. 1-16. (Year: 2016).\*
Leem et al., ACS Appl. Mater. Interfaces, 2015, 7, 8, 2349-2358. (Year: 2015).\*
Werner, Jeremie. Perovskite/Silicon Tandem Solar Cells: Toward Affordable Ultra-High Efficiency Photovoltaics. EPFL, 2018 Aug. 31, 2018 (Aug. 31, 2018).

\* cited by examiner

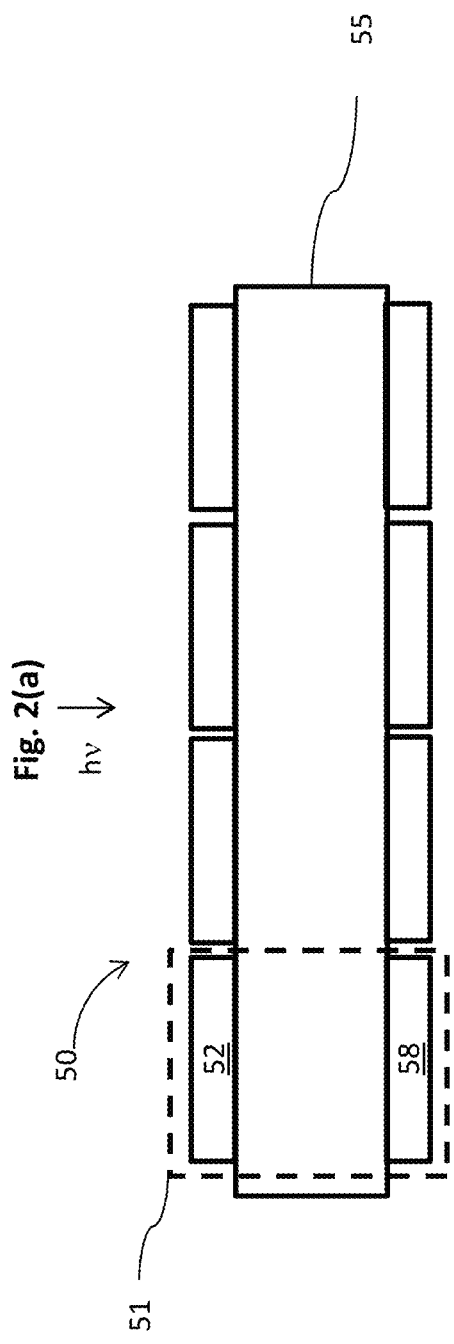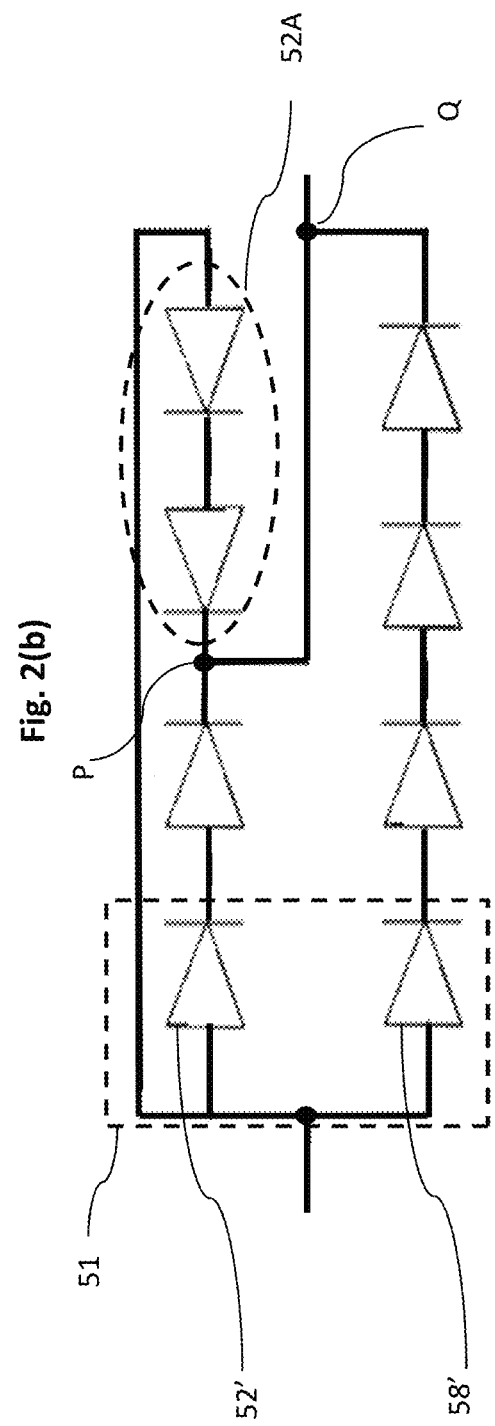

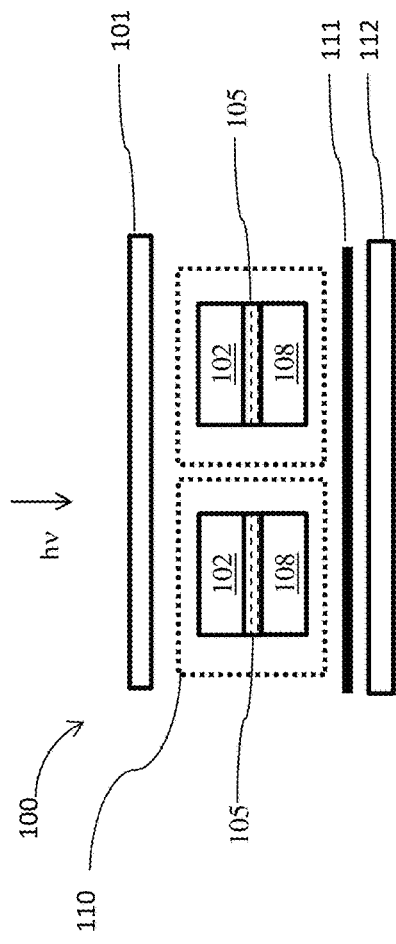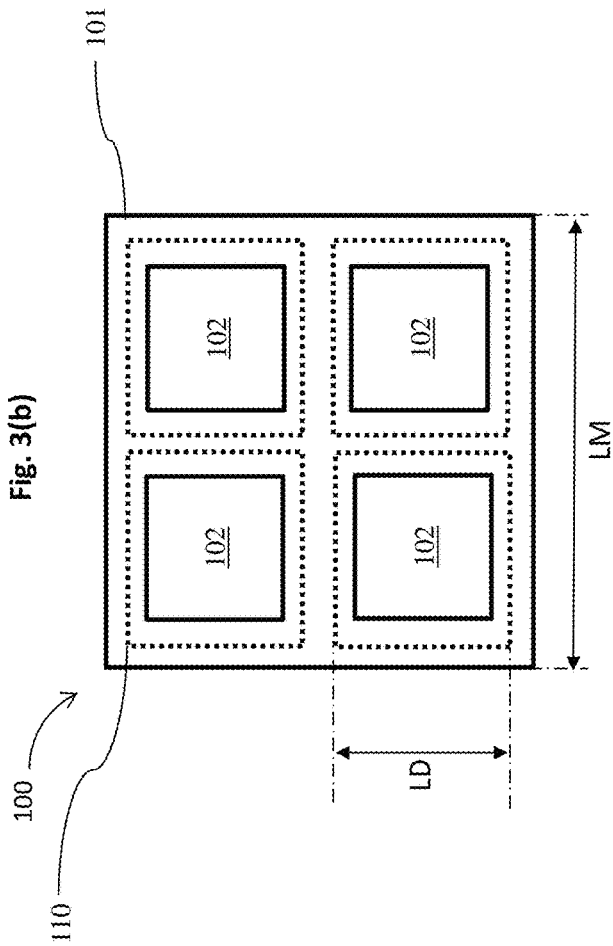

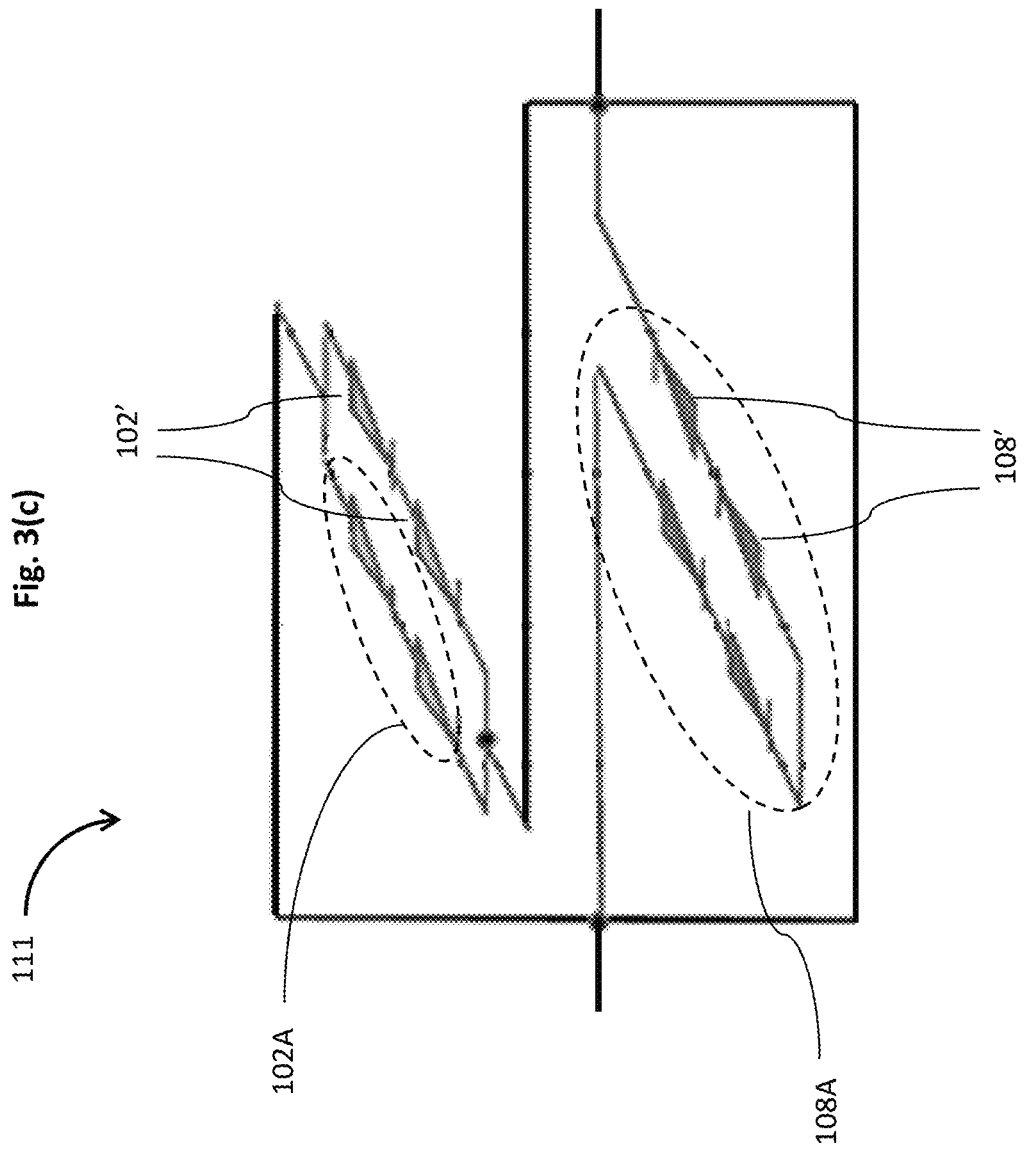

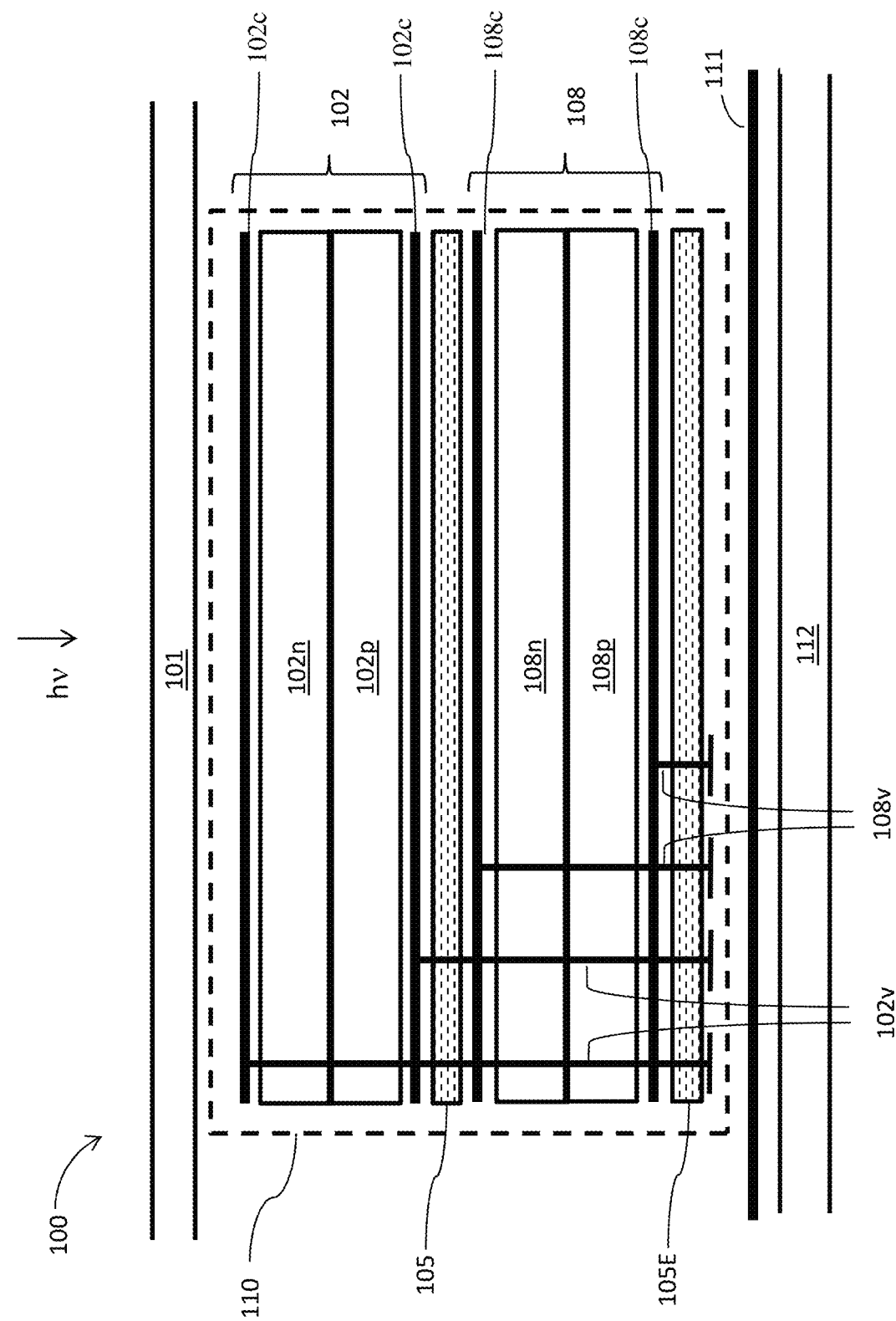

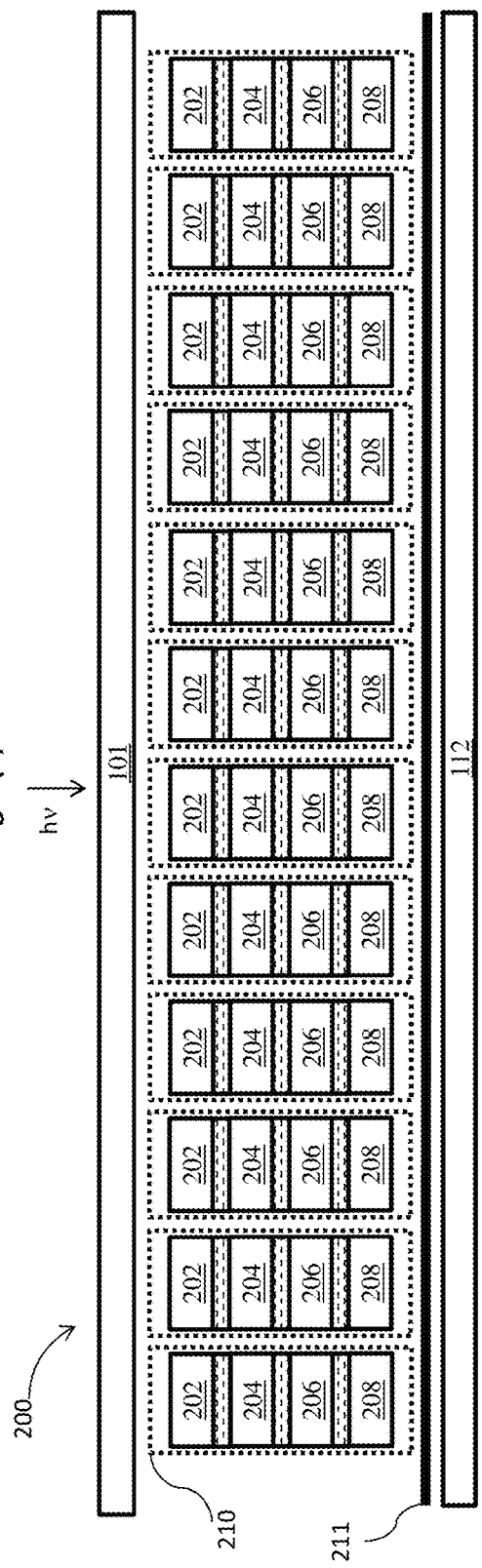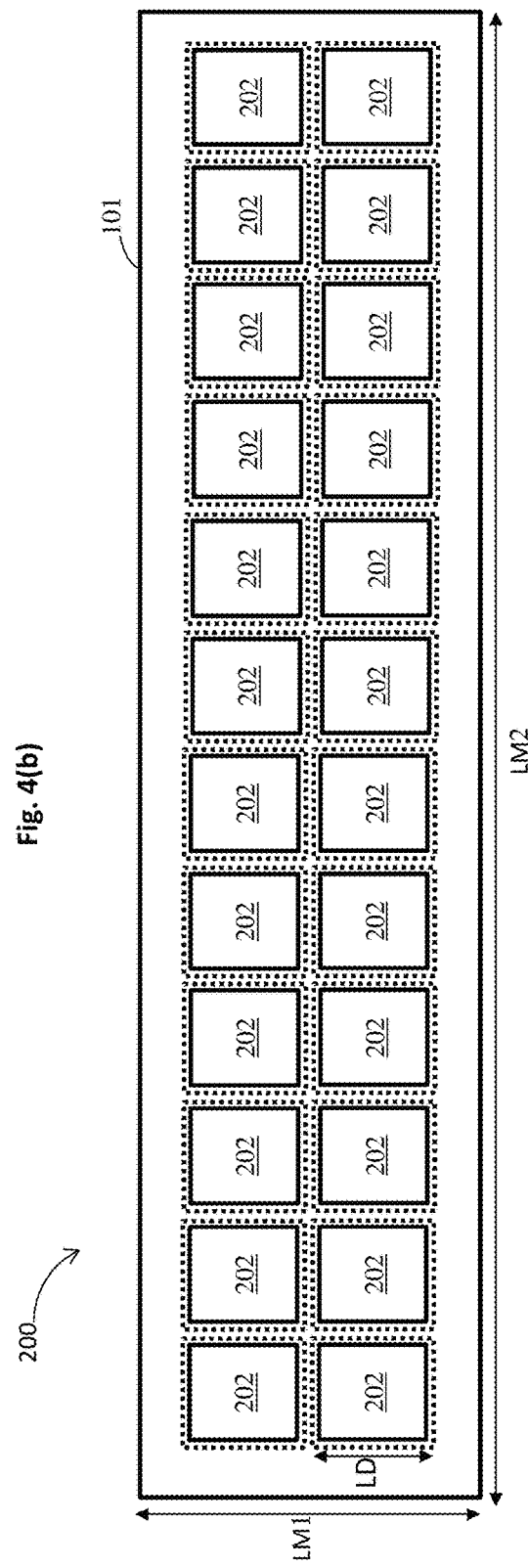

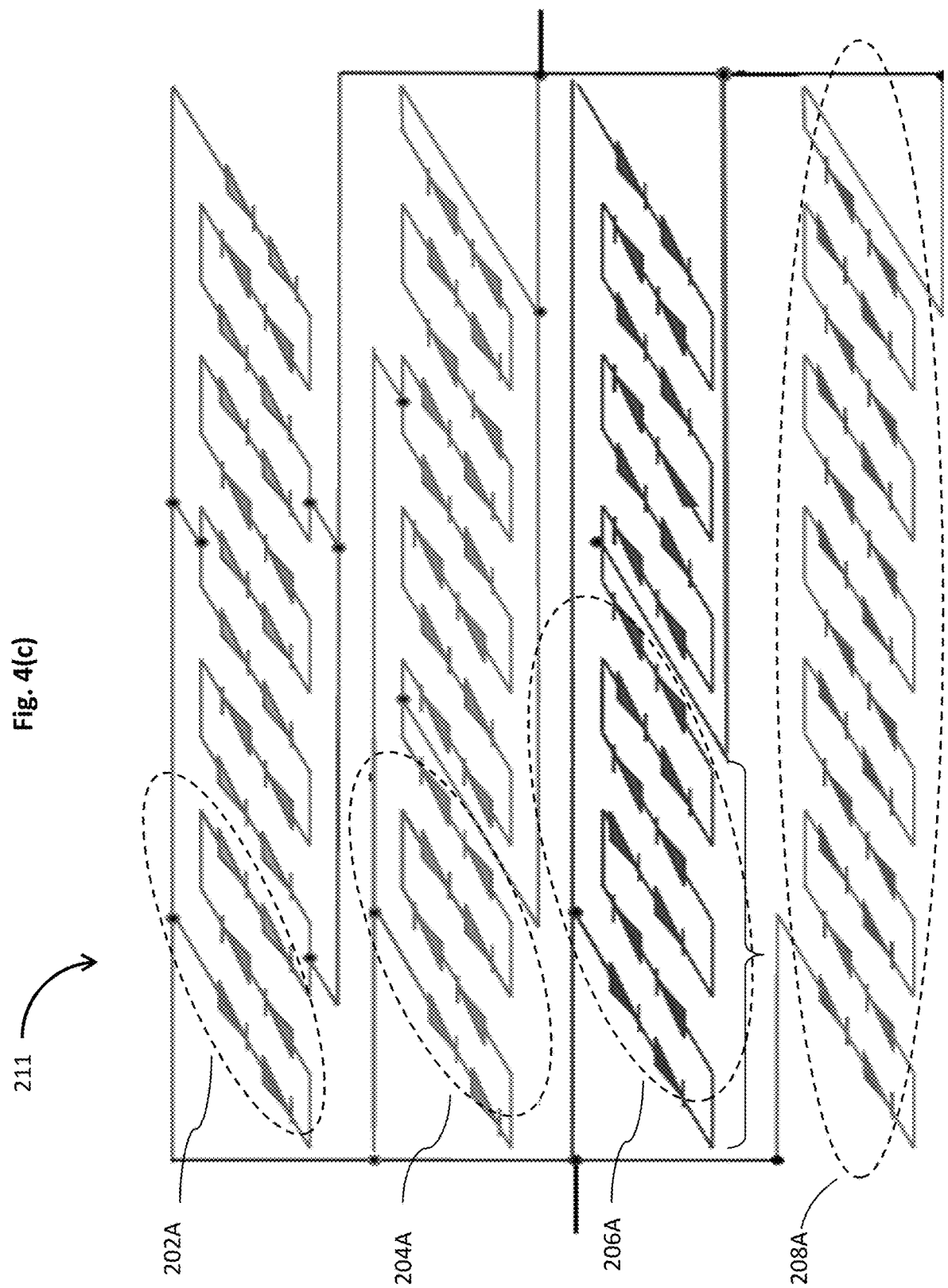

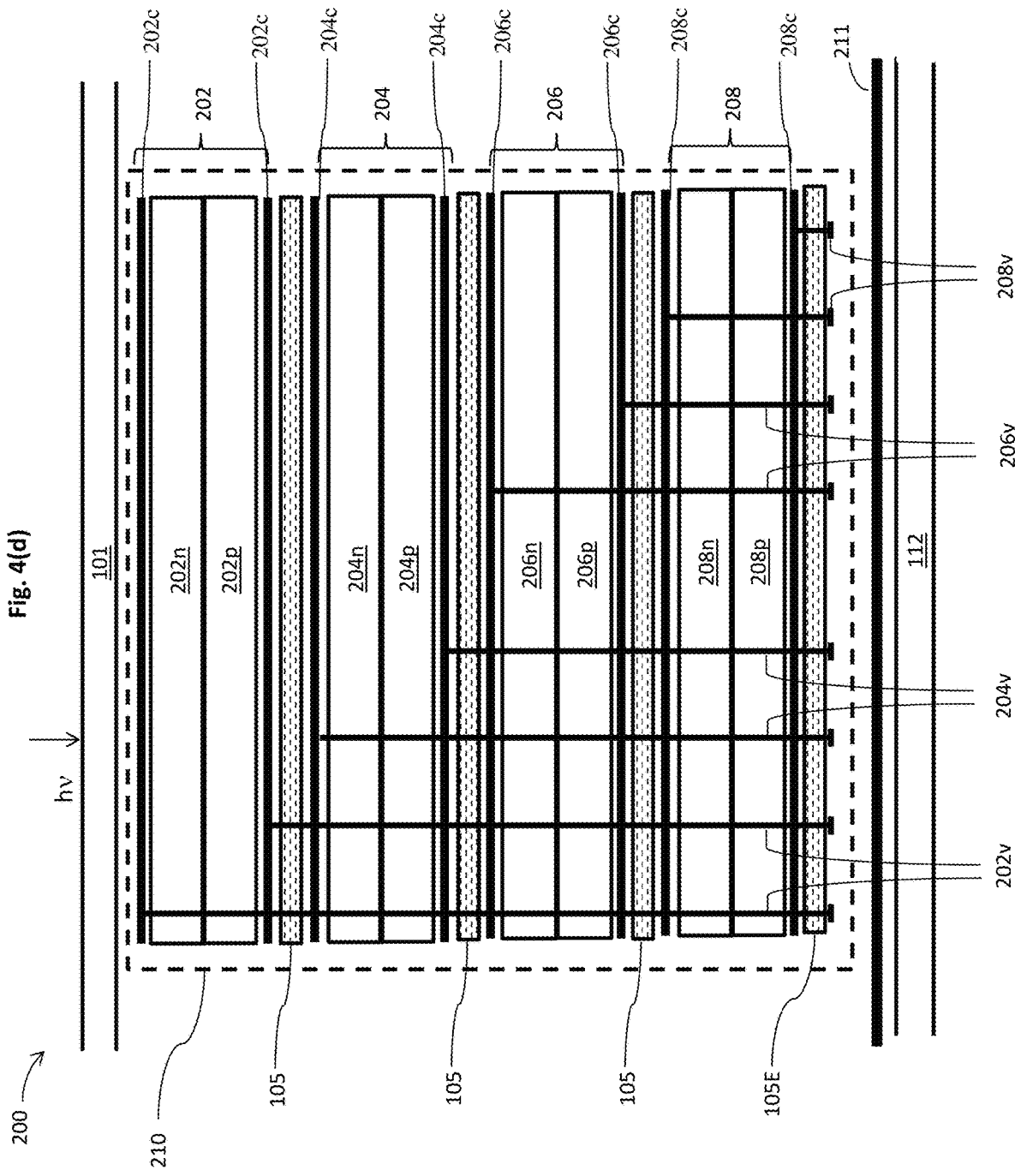

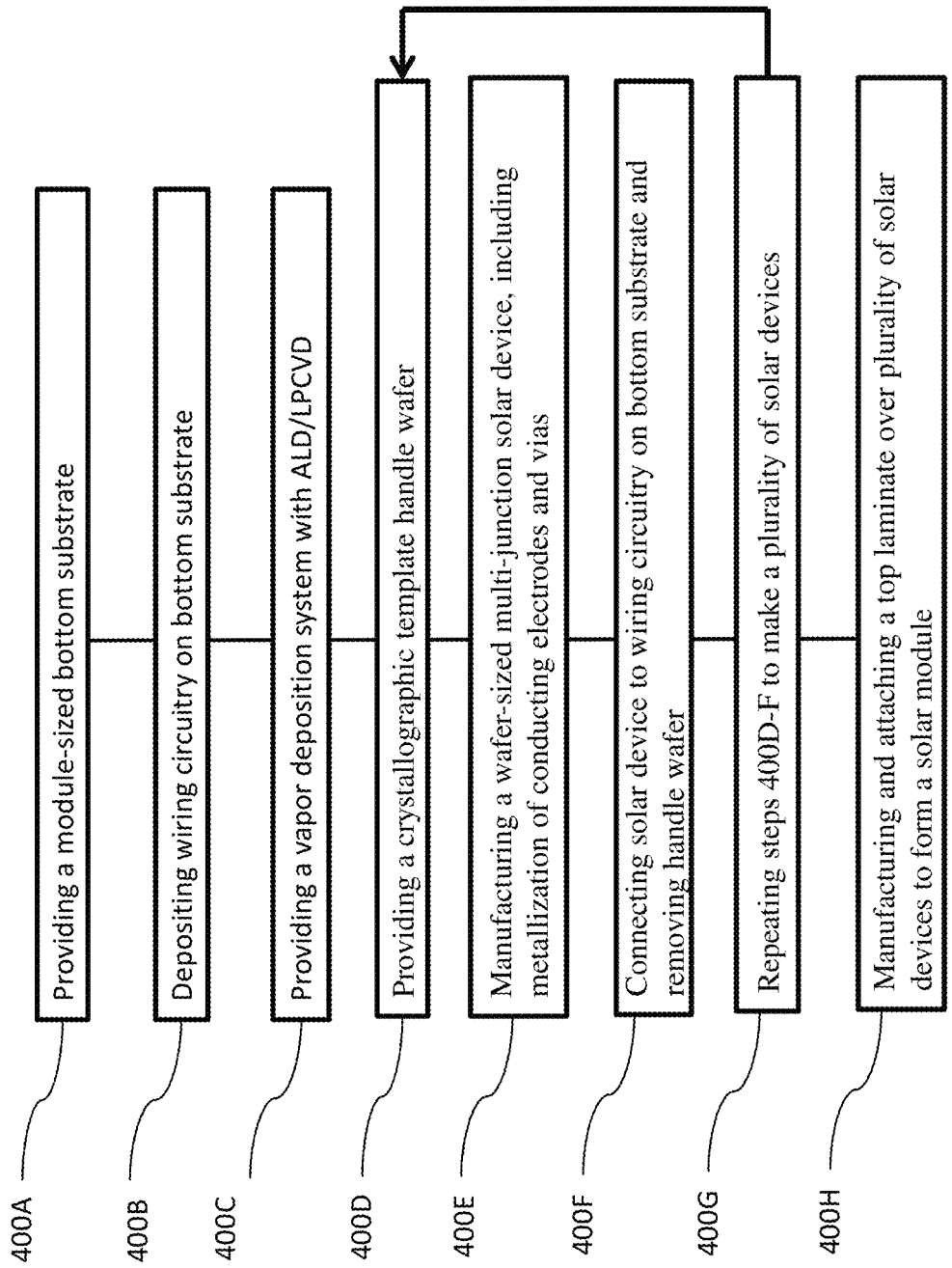

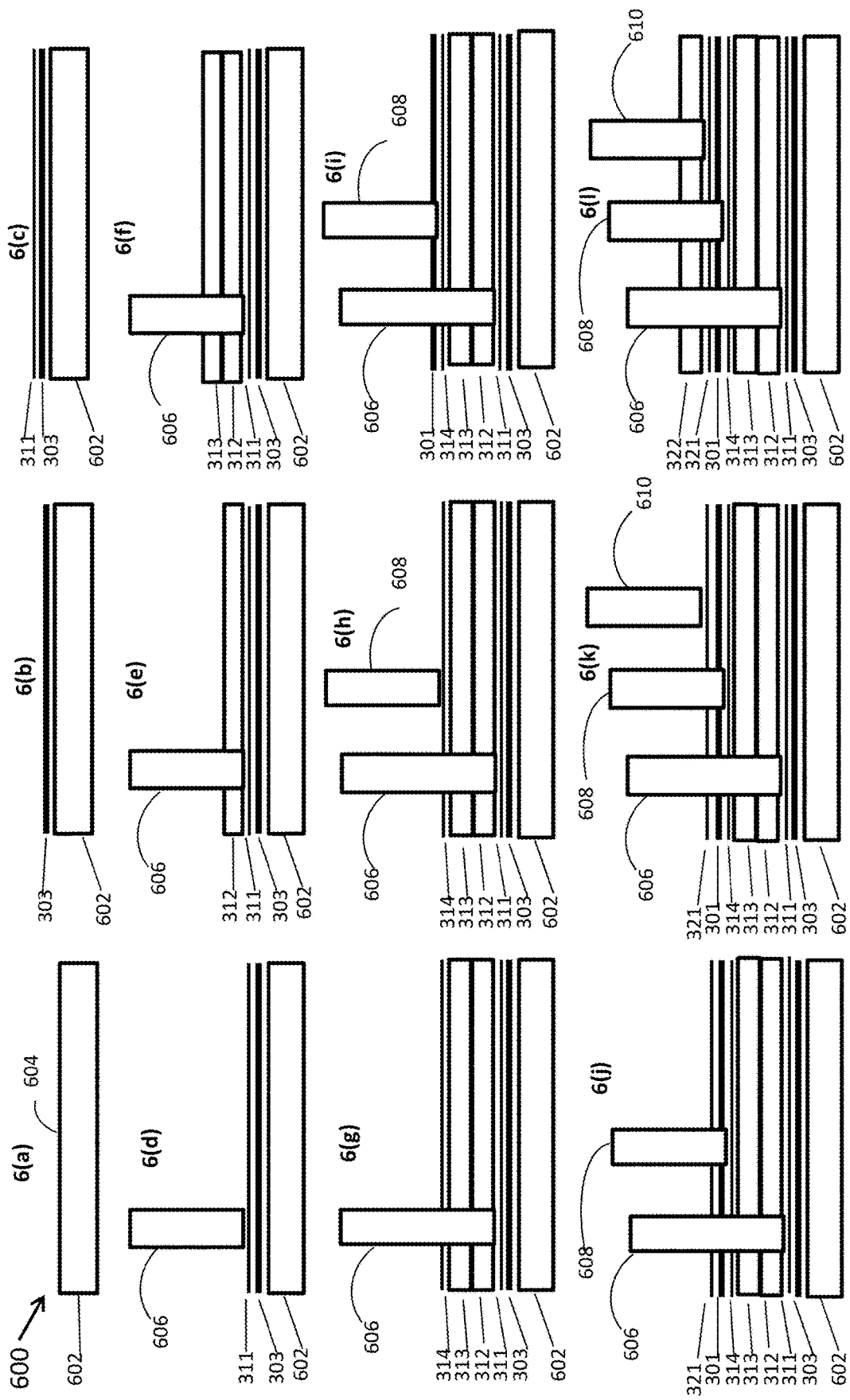

VOLTAGE-MATCHED MULTI-JUNCTION SOLAR MODULE MADE OF 2D MATERIALS

CROSS REFERENCES TO RELATED APPLICATIONS

This application is related to and claims priority from commonly owned U.S. Provisional Patent Application Ser. No. 62/620,519, entitled: "Tandem Solar Device of Isolated PV Sub-cells and Method of Fabrication", filed on Jan. 23, 2018, the disclosure of which is incorporated herein by reference in its entirety.

TECHNICAL FIELD

This invention relates to photovoltaic modules and their manufacture, and in particular to voltage-matched multi-junction solar modules.

BACKGROUND OF INVENTION

A voltage-matched multi-junction solar module consists of a plurality of voltage-matched multi-junction solar cells (VMMJSCs), serially connected in a string. Each VMMJSC is a vertical stack of two or more photovoltaic cells, hereinafter referred to as "PV cells", separated by a dielectric layer, each of which absorbs different wavelengths, or colors, belonging to the spectrum of incident solar radiations. Typically, short solar wavelengths, corresponding to blue and green color bands, are absorbed in the uppermost PV cell, i.e. the one which first receives the sun's radiation, and long solar wavelengths, corresponding to red and infrared color bands, are absorbed in one or more PV cells which are deeper in the vertical stack. In this document, references are made to directions such as uppermost, deeper, top, bottom, and variations thereof. These directional references are exemplary, to show the disclosed subject matter in an example orientation, and are in no way limiting.

Various wiring configurations for voltage-matched multi-junction solar cells, hereinafter referred to as just "solar modules", have been proposed in the prior art. For example, U.S. Pat. No. 9,287,431 to Mascarenhas and Alberi, issued on Mar. 15, 2016, hereinafter referred to as MA'431, discloses a thin film voltage-matched multi-junction solar cell and methods of producing cells having upper CdTe p-n junction layers formed on a transparent substrate which, in the completed device, is operatively positioned in a superstrate configuration. As another example, US Patent Publication 2015/0340528 A1, to Alberi and Mascarenhas, dated Nov. 26, 2015, discloses a thin film voltage-matched multi-junction solar cell and methods of producing cells having a first p-n junction with a first band-gap energy, a second p-n junction with a second band-gap energy and an insulating layer between the first and second p-n junctions.

In the prior art, the p-n junctions of different PV cells do not fully overlap. As a result, the fabrication of each PV cell requires its own dedicated masks for trenching, metallization, and encapsulation. This adds to the complexity and cost of the manufacturing process.

It would be highly desirable to have a solar module, in which all of the PV cells fully overlap, as this would enable a streamlined manufacturing process. The present invention discloses a solar module having fully-overlapped PV cells and no reduction in efficiency due to shading by electrodes, as well as a method of manufacture using van der Waals (vdW) epitaxy performed by atomic layer deposition (ALD) and low pressure chemical vapor deposition (LPCVD).

SUMMARY OF THE INVENTION

The present invention is a voltage-matched solar module for converting incident solar radiation into electricity, and a method for producing the solar module which utilizes an ALD/LPCVD tool for van der Waals epitaxy of 2D materials.

The solar module consists of a plurality of wafer-sized multi-junction solar devices and wiring circuitry adjacent to a module-sized bottom substrate. Each solar device has at least two photovoltaic (PV) cells separated by electrically insulating transparent layers. The PV cells are aligned so as to overlap and are electrically connected to the wiring circuitry by conducting vias. The wiring circuitry includes a multiplicity of serial strings electrically connected in parallel and having substantially the same voltage.

The method of producing the solar module consists of the sequence of steps:
 (a) providing a module-sized bottom substrate;
 (b) depositing wiring circuitry on the bottom substrate;
 (c) providing a vapor deposition system having Atomic Layer Deposition (ALD) and Low Pressure Chemical Vapor Deposition (LPCVD) modes;
 (d) providing a crystallographic template handle wafer;
 (e) manufacturing a wafer-sized multi-junction solar device, including metallization;
 (f) connecting the solar device to the bottom substrate and removing the handle wafer;
 (g) repeating steps (d), (e), and (f) to make a plurality of solar devices; and
 (h) manufacturing and attaching a top laminate over the plurality of solar devices.

BRIEF DESCRIPTION OF THE FIGURES

The invention is herein described, by way of example only, with reference to the accompanying drawings, wherein:

FIGS. 2(a) and 2(b) are drawings showing an exemplary solar module with overlapping PV cells, according to the principles of the present invention, for comparison with the prior art of FIGS. 1(a) and 1(b).

FIGS. 3(a)-(d) are schematic diagrams showing a first exemplary embodiment of a solar module having four wafer-sized multi-junction solar devices.

FIGS. 4(a)-(d) are schematic diagrams showing a second exemplary embodiment of a solar module, having twenty-four wafer-sized multi-junction solar devices.

FIG. 5 is a block diagram showing the steps of an exemplary manufacturing method for producing a solar module according to the present invention.

DETAILED DESCRIPTION OF THE PREFERRED EMBODIMENTS

Figure 1A:
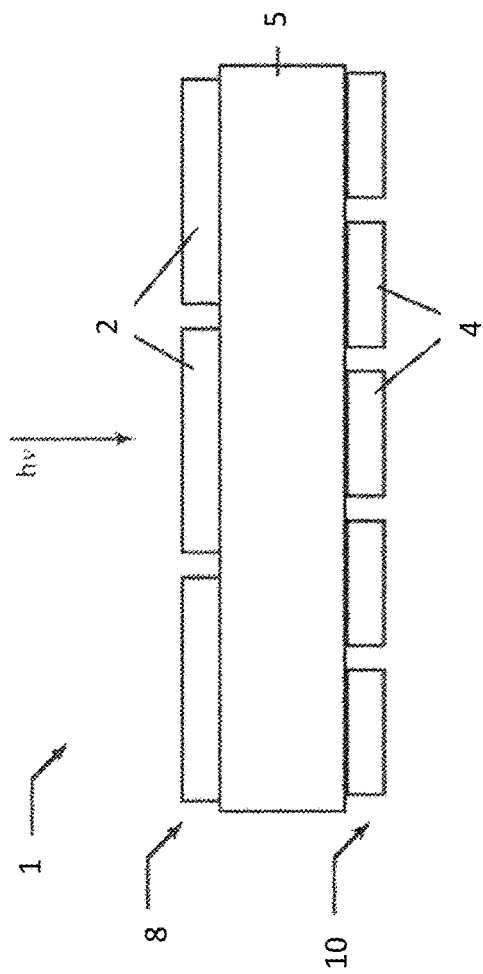
FIGS. 1(a) and 1(b) are drawings showing a solar module with non-overlapping PV cells according to the prior art.
Figure 1B:
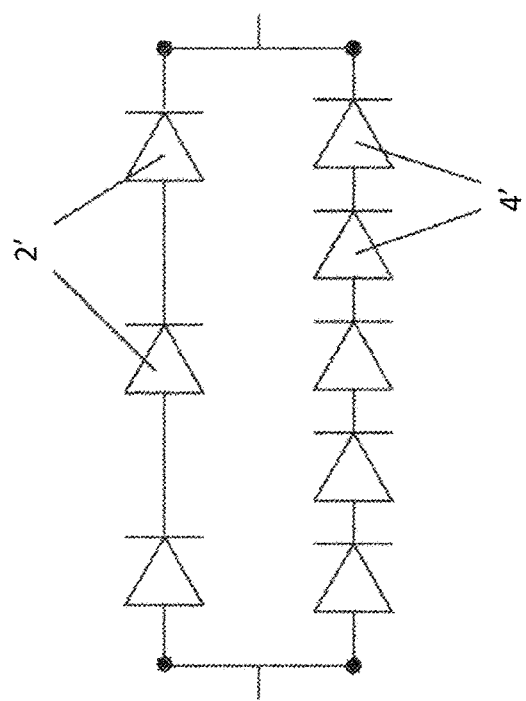

FIGS. 1(a) and 1(b) are drawings of a solar module according to the prior art, such as that disclosed in FIGS. 1 and 2 of MA'431. In FIGS. 1(a) and 1(b), solar radiation photons of energy hv, where "h" is Planck's constant and "v" is the photon frequency which is inversely proportional to the photon wavelength, are incident on solar module 1. First and second p-n junctions 2 and 4, respectively, are separated by an electrically insulating transparent layer 5. The bandgap energy of p-n junction 2 is greater than that of p-n junction 4. Therefore, photons of short solar wavelength are absorbed in p-n junction 102, and photons of long solar wavelength pass through p-n junction 2 and transparent layer 5 and are absorbed in p-n junction 4. Upper layer 8 consists of three p-n junctions 2, and lower layer 10 consists of five p-n junctions 4.

FIG. 1(*b*) shows a wiring diagram for solar module 1, according to the prior art. The three diodes corresponding to p-n junctions 2, which are denoted by 2', are electrically connected in series to form an upper string. Similarly, the five diodes corresponding to p-n junctions 4, which are denoted by 4', are connected in series to form a lower string. Finally, the two strings are connected in parallel to form a two terminal device, as shown in FIG. 1(*b*).

Voltage matching is achieved by selecting the materials of p-n junctions 2 and 4 so that the combined output voltage for the upper string is approximately equal to that of the lower string. Note, however, that the area of p-n junction 4 is approximately 3/5 of the area of p-n junction 2; thus, the p-n junctions of upper layer 8 do not fully overlap those of lower layer 10. As a result, the manufacturing process is complex, requiring many different lithographic masks and processing steps.

FIGS. 2(*a*) and 2(*b*) are drawings of an exemplary solar module with overlapping PV cells, according to the principles of the present invention, in contrast to the prior art. Incident solar radiation photons of energy hv are incident on solar module 50, which consists sequentially of an upper layer of four p-n junctions 52, an electrically insulating transparent layer 55, and a lower layer of four p-n junctions 58. As before, photons of short solar wavelength are preferentially absorbed in the upper layer, and those of long solar wavelength are preferentially absorbed in the lower layer.

FIG. 2(*b*) shows a wiring diagram for solar module 50. The four diodes 52', which correspond to the four p-n junctions 52, are split into two upper strings 52A, each of which consists of two diodes 52' connected in series. The two upper strings 52A are connected in parallel at point P. The four diodes 58', which correspond to the four p-n junctions 58, are connected in series to form a single lower string. Finally, the single lower string is connected in parallel with both upper strings 52A at point Q to form a two terminal device. The total output current is the sum of the individual output currents of the lower string and the two upper strings, and it varies with daily and seasonal fluctuations in solar intensity.

Voltage matching in FIG. 2(*b*) is achieved by selecting the materials of p-n junctions 52 and 58 so that the output voltage for each upper string 52A is approximately equal to that of the lower string. For example, suppose each diode 52' outputs two volts, and each diode 58' outputs one volt. The combined voltage of the lower string is equal to 4×1=4 volts; the combined voltage of each upper string 52A is equal to 2×2=4 volts, which is the same as the output voltage of the lower string.

FIGS. 2(*a*) and 2(*b*) differ from the prior art in that:
(a) the p-n junctions of the upper layer fully overlap those of the lower layer;
(b) the number of p-n junctions is the same for both layers; and
(c) voltage matching is achieved by splitting the diodes of the upper layer into more than one (in this case two) parallel strings.

The implications of the above differences between the present invention and the prior art are far-reaching. First, solar module 50 can be assembled by making four individual multi-junction solar devices 51, each of which consists of two p-n junctions, separated by an electrically insulating transparent layer. Because the p-n junctions completely overlap, solar device 51 can be manufactured in one continuous process, applied to the entire surface of a wafer. Second, because solar device 51 is flat, with no trenches, the uninterrupted process consists of stacking successive layers of conducting, semiconducting, and insulation materials in a single successive run requiring no etching or lithography. Third, using processes for epitaxial growth such as atomic layer deposition (ALD) and van der Waals (vdW) epitaxy, solar device 51 is a crystalline monolith in which all of the p-n junctions, conductors and insulators are crystalline, as opposed to prior art solar devices in which only one of the semiconductor layers in the stack is crystalline, and the other semiconductor layers are polycrystalline or amorphous. This is especially significant, insofar as crystalline PV cells are known to have about double the energy conversion efficiency of polycrystalline or amorphous PV cells. Fourth, the successive process for manufacturing solar devices 51 includes conducting vias and pads drawn to the back (bottom) of the device. The solar module 50 is then assembled by placing solar devices 51 in electrical contact with wiring circuitry mounted on a protective module-sized bottom substrate. In this way, there is no front shading of the device by any metal grid, which is an advantage over the prior art, in which shading is a significant cause of reduced solar conversion efficiency.

The principles of the present invention are elucidated in greater detail in FIGS. 3(*a*)-(*d*), which show schematic diagrams of a first exemplary embodiment according to the present invention, having four wafer-sized multi-junction solar devices 110.

FIG. 3(*a*) is a cross-sectional view of a solar module 100 receiving solar radiation photons, of energy hv, from above. The photons pass through a module-sized transparent top laminate 101 and enter a multiplicity of four wafer-sized multi-junction solar devices 110 which are in electrical contact with wiring circuitry 111, which is in physical contact with module-sized bottom substrate 112. Each solar device 110 consists of two PV cells, 102 and 108, separated by an electrically insulating transparent layer 105.

FIG. 3(*b*) is a top view of solar module 100, in which four solar devices 110 are arranged in a 2-by-2 array. The transverse dimension LD of solar device 110 is commensurate with the size of a semiconductor wafer, which is typically 2, 4, 6, 8, or 12 inches wide. The transverse dimension LM of solar module 100 is roughly twice the size LD.

FIG. 3(*c*) shows a diagram for wiring circuitry 111 of solar module 100. The wiring circuitry consists of two serial strings 102A, which are connected in parallel to each other, and a single serial string 108A. Each serial string 102A is a series connection of two diodes 102', corresponding to two PV cells 102; single serial string 108A is a series connection of four diodes 108', corresponding to four PV cells 108. Serial strings 102A and serial string 108A have substantially the same voltage and are electrically connected in parallel.

As a numerical example, suppose each diode 102' outputs two volts, and each diode 108' outputs one volt. The combined voltage of serial string 108A is equal to 4×1=4 volts.

The combined voltage of each serial string 102A is 2×2=4 volts, which is the same as the output voltage of serial string 108A.

FIG. 3(d) is a vertical cross-section showing the various layers and vias of solar module 100. Proceeding from the top down, solar device 110 consists of two PV cells 102 and 108 separated by electrically insulating transparent layer 105. PV cell 102 consists of two conducting electrodes 102c and a p-n junction formed by staggered (type II) heterostructure alignment or by n-doped and p-doped semiconductor layers, 102n and 102p, respectively. Similarly, PV cell 108 consists of two conducting electrodes 108c and a p-n junction formed by type II alignment or n-doped and p-doped semiconductor layers, 108n and 108p, respectively. The key difference between the two PV cells is that the bandgap width of the p-n junction of PV cell 102 is wider than that of PV cell 108.

In an alternative embodiment of solar device 110, the positions of the n-type semiconductors may be interchanged with those of the p-type semiconductors in either PV cell 102 and or in PV cell 108.

Conducting electrodes 102c and 108c are electrically connected to wiring circuitry 111, by means of conducting vias 102v and 108v, which terminate in conducting pads beneath insulating encapsulation layer 105E.

FIGS. 4(a)-(d) show schematic diagrams of a second exemplary embodiment according to the present invention, having twenty-four wafer-sized multi-junction solar devices 210.

FIG. 4(a) is a cross-sectional view of a solar module 200 receiving solar radiation photons, of energy hv, from above. The photons pass through a module-sized transparent top laminate 101 and enter a multiplicity of twenty-four wafer-sized multi-junction solar devices 210 which are in electrical contact with wiring circuitry 211, which is in physical contact with module-sized bottom substrate 112. Each solar device 210 consists of four PV cells—202, 204, 206 and 208—which are separated from each other by electrically insulating transparent layers 105.

FIG. 4(b) is a top view of solar module 200, in which twenty-four solar devices 210 are arranged in a 2-by-12 array. As in FIG. 3(b), transverse dimension LD of solar device 210 is commensurate with the size of a semiconductor wafer, which is typically 2, 4, 6, 8, or 12 inches wide. Transverse dimensions LM1 and LM2 of solar module 200 are roughly twice and twelve times the size LD, respectively.

FIG. 4(c) shows a diagram for wiring circuitry 211 of solar module 200. The wiring circuitry consists of:
(a) four serial strings 202A connected in parallel, each of which is a series connection of of 6 diodes 202', corresponding to 6 PV cells 202;
(b) three serial strings 204A connected in parallel, each of which is a series connection of 8 diodes 204', corresponding to 8 PV cells 204;
(c) two serial strings 206A connected in parallel, each of which is a series connection of 12 diodes 206', corresponding to 12 PV cells 206; and
(d) one serial string 208A, which is a series connection of 24 diodes 208', corresponding to 24 PV cells 208.

Serial strings 202A, 204A, 206A, and 208A have substantially the same voltage and are electrically connected in parallel.

As a numerical example, suppose each diode 202' outputs 1.6 volts; each diode 204' outputs 1.2 volts; each diode 206' outputs 0.8 volts; and each diode 208' outputs 0.4 volts. The output voltage of serial string 202A is 6×1.6=9.6 V; that of serial string 204A is 8×1.2=9.6 V; that of serial string 206A is 12×0.8=9.6 V; and that of serial string 208A is 24×0.4=9.6 V. Thus all the serial strings have substantially the same output voltage.

FIG. 4(d) is a vertical cross-section showing the various layers and vias of solar module 200. Proceeding from the top down, solar device 210 consists of four PV cells—202, 204, 206, and 208—separated by electrically insulating transparent layers 105. Each PV cell consists of a pair of conducting electrodes (pairs 202c, 204c, 206c, and 208c), and a p-n junction formed by n-type semiconductor layers (202n, 204n, 206n, and 208n) and p-type semiconductor layers (202p, 204p, 206p, and 208p). n-type and p-type pairs can be accomplished by a staggered (type II) alignment of two semiconductor materials or by slight diversion in composition, or by n-doping or p-doping of the semiconductor.

In general the p-n junctions of PV cells 202, 204, 206, and 208 have monotonically decreasing bandgap widths, and provide preferential absorption of solar radiation photons in blue, green, red, and infrared spectral bands, respectively.

In an alternative embodiment of solar device 210, the positions of the n-doped semiconductors may be interchanged with those of the p-doped semiconductors in any of the PV cells 102, 104, 106 and 108.

Clearly, the use of wiring circuitry with serial strings connected in parallel can be extended from a solar module having 2×12 solar devices to one having, say, 6×12 solar devices. In the latter case, using diode output voltages as in the above numerical example, the various serial strings would have an output voltage equal to 72×0.4=28.8V.

The diode output values used in the above numerical examples can be generalized to solar devices with an arbitrary number of PV cells and to solar modules with an arbitrary number of solar devices, by using the following algorithm.

i. Select the number of PV cells (N) in each solar device. For example, N=2 for the first exemplary embodiment and N=4 for the second exemplary embodiment.
ii. Set the open circuit voltage of the bottom PV cell, namely the one with the smallest bandgap width, to approximately Voc1=1.8/N volts. This is also the voltage increment between two adjacent PV cells.
iii. Set the desired output voltage of the solar module (Vm). Estimate the number (M) of solar devices in the solar module by a whole number which is close to Vm/Voc1 and which is divisible by the numbers 1 to N.
iv. Reset the value of Voc1 to be equal to Vm/M. Iterate Voc1 and Vm to get optimal values.
v. Determine the open circuit voltages of the other PV cells.
vi. Estimate the bandgaps and choose semiconductor materials for all PV cells.

As a numerical example, consider the case N=3 (step i.). Next, set Voc1=1.8/3=0.6 volts (step n Next, set Vm=24 volts, and estimate M=(24/0.6)=40. To make M divisible by 1,2, and 3, choose M=42 (step iii.). Reset the value of Voc1 to 24/42=0.57 volts (step iv.). Set the open circuit voltage of the second PV cell to 2×0.57=1.14 volts, and of the third PV cell to 3×0.57=1.71 volts (step v.). Estimate the bandgaps to be Eg1=0.57+0.4=0.97 eV, Eg2=1.14+0.4=1.54 eV, and Eg3=1.71+0.4=2.11 eV. Choose semiconductor materials to make p-n junctions with these bandgaps.

Conducting electrodes 202c, 204c, 206c, and 208c are electrically connected to wiring circuitry 211, by means of conducting vias 202v, 204v, 206v, and 208v, respectively. The conducting vias terminate in conducting pads beneath insulating encapsulation layer 105E.

In the exemplary embodiments, it is preferable that the dimensions and material of the wiring circuitry, 111 and 211, be chosen so as to reflect solar photons that are not absorbed in a first pass through solar devices 110 and 210, respectively. On reflection, these photons are given a second opportunity to undergo absorption and thereby to enhance the overall conversion efficiency of the solar module.

Module-sized bottom substrate 112 is preferably made of plastic, glass, composite or stainless steel with an additional dielectric layer to prevent electrical contact with the wiring circuitry.

Materials

The layers of solar devices 110 and 210, as shown in detail in FIGS. 3(d) and 4(d) generally comprise three kinds of materials, namely insulators, conductors and semiconductors. Preferentially, the layers should be stacked monolithically in a Superstrate mode, should be crystalline and transparent in the proper solar spectrum, and should be thin-films having the smallest thickness that allows them to function at maximum efficiency. Growing a crystalline super-stratum of different materials is called hetero-epitaxy, which is constrained to a small lattice mismatch. Materials with a larger mismatch can be grown using vdW epitaxy. A vdW interface can be formed when a layered material is grown on a cleaved face of another layered material or on a three-dimensional material substrate, such as Si or GaAs, if the dangling bonds on its surface are terminated by proper atoms rendering it inert.

Van der Waals (vdW) epitaxy was invented by Atsushi Koma et al. and is described in Microelectronic Engineering, no. 2, 1984, p. 129. Growth of planar three-dimensional (3D) material films on two-dimensional (2D) materials has been demonstrated for CdSe deposited on Mica, as described in Nanoscale, 2016, no. 8, p. 11375. To expand the range of materials and phases available for constructing a hetero-structure, it is highly desired to endorse Koma's method and to use vdW epitaxy. In this way, two chemically non-reactive crystalline surfaces can match to form a monolithic structure without little if any regard for the lattice constants of their constituents. Such non-reactive crystalline surfaces can be found naturally in 2D layered materials or artificially in saturated surfaces of 3D material.

A 2D layered material consists of crystalline slabs stacked vertically like pages in a book. A slab can comprise one mono-layer, such as hexagonal boron nitride (h-BN), or a binary, ternary or quaternary compound single crystal, such as Bi2Sb3, which has a thickness ranging from 3 to about 10 Å. Adjacent slabs are separated by a vdW intra-space of about 3.5 angstroms (Å). The slabs are firmly bonded together by covalent or ionic chemical bonds, which are about 100 times stronger than the vdW forces between adjacent slabs. In order to be chemically inactive, the surface of the 2D slab must be smooth and have no dangling bonds extending from it. The attractive vdW forces between adjacent slabs arise from slightly overlapping electron orbitals.

Saturated or "terminated" 3D material surfaces are quite common, for example a silicon surface may be terminated with hydrogen, fluoride, sulfide, selenide, nitride, and other materials. A GaAs surface may be terminated by selenide, H—Ga, and other materials. Experimental evidence indicates that 3D materials such as GaN, GaAs, CdTe, GeAsSe, PbSnSe, when grown on a 2D layered material, tend to grow as 2D layered material, or what might be called a "planar 3D layered material" or as "2D non-layered material". Koma called it a "Quasi vdW epitaxy". It appears that nearly any 2D or 3D material can be grown as a layered material if grown on a passivated and smooth 2D material surface.

Electrically insulating transparent layers 105 which separate adjacent PV cells may be comprised of wide bandgap 2D materials such as halogenides, oxides, nitrides of groups IA, IIA, IIIA, IVA, IIIB, IVB such as $MgBr_2$, $SrIF$, $BaIF$; $ScBr_3$, $YI_3$, $CdI_2$; 2D oxides: Graphene oxide, $P_4O_{10}$; $Ti_{0.87}O_2$, $LaNb_2O_7$, $(Ca,Sr)_2Nb_3O_{10}$, $CaLaNb_2TiO_{10}$, $La_2Ti_2NbO_{10}$, ZnO, ZnS, and nitrides like hexagonal-Boron Nitride (h-BN). h-BN is preferable for its electrical insulating properties, exotic opto-electrical properties together with mechanical robustness, thermal stability, and chemical inertness. The dielectric constant of h-BN is 1.8, just like Teflon and its dielectric strength is 700 KV/mm, as compared with 173 KV/mm for Teflon.

The conducting electrodes of the solar module of the present invention may be comprised of halogenides of vanadium, $AlCl_2$, $YGaI$, $Ag_2ReCl_6$, $CuS$, $FeLiP$, $FeS$, $FeTe$, $SbSiNi$, $ZnIn_2S_4$, $Zn_2In_2S_5$, transition metal dichalcogenides (TMDC) of Y, Ti, V, Nb, Ta, Cr, Co, Rh, Ir, Ni, and preferably Graphene (Gn) nano-sheets. Gn is a semi-metal with electron mobility μ on a boron nitride substrate of $10^5$ $cm^2/V-s$, about 60 times higher than that of silicon and 1400 times higher than that of indium tin oxide (ITO). Gn has an electrical resistivity of $10^{-8}$ Ω-m, about 60% that of silver. Pristine Gn is a p-type conductor with work-function ø of 4.7 eV. To convert it to n-type material (as in cathodes), Gn is doped with nitrogen. Best doping is achieved by integrating N atoms in the graphene honeycomb mesh. Gn is transparent to the solar radiation spectrum, with a transparency of 97.7%. The thickness of graphene is just 0.34 nanometers (nm). Experiments have indicated that Gn can stabilize 2D forms of traditionally 3D binary compounds. When Gn electrodes surround a p-n junction, as in FIGS. 3(d) and 4(d), Gn also has the advantage of acting as an "epitaxial catalyst".

The photoactive absorbing materials comprising the p-n junctions are monocrystalline direct bandgap 2D semiconductors, having low exciton binding energy, or 2D non-layered materials. The merit of monocrystalline structures lies in having fewer defects, like grain boundaries and dislocations, which tend to reduce fill factor through recombination and annihilation of free carriers. Typically, a single crystalline absorber offers twice the efficiency of analog polycrystalline material.

A direct bandgap transition ensures high absorption coefficient which translates to lean thickness. To be applied as an absorber in a PV cell, the semiconductor should retain its direct transition at notable thicknesses. Having direct transition merely in a monolayer like in the case of TMDCs (such as $MoS_2$), is not enough for ample absorbance. The absorber should thus be a direct semiconductor with a thickness in the range of a few 100 nm. Low binding energy of the excitons warrants high open-circuit voltage (Voc) and rapid diffusion of photo carriers to the electrodes. Typically, 3D and thick 2D layered materials have lower binding energy. To ensure large sun spectrum absorption the semiconductor bandgap (Eg) should be between about 2.4 eV to about 0.5 eV.

The field of 2D layered and non-layered (3D) planar materials is expanding rapidly; to date it comprises some 700 different materials, with a high proportion being semiconductors. Most of the semiconductors within a chemical group afford alloying, thus facilitating bandgap engineering. As an example, in group III-VI, GaSe (Eg=1.9 eV) can be alloyed with GaTe (Eg=1.65 eV) to produce $GaSe_{0.4}Te_{0.6}$ with an intermediate Eg of 1.70 eV.

Table 1 below is a list of exemplary 2D and 3D semiconductor materials that can be used for the p-n junctions in the PV cells of this invention. The bandgaps of these materials have direct transition, and have energies in the range of 0.5-2.5 eV.

TABLE 1

| III-VI | Eg eV | notes | III-V | Eg eV | notes | V-VI | Eg eV | notes |
|---|---|---|---|---|---|---|---|---|
| GaS | 2.4 | 2D | GaAs | 1.43 | 3D | $As_2S_3$ | 2.7 | 2D |
| GaSe | 1.9 | 2D | GaSb | 0.73 | 3D | $As_2Se_3$ | 1.78 | 2D |
| GaTe | 1.45 | 2D | InN | 0.7 | 3D | $As_2T_3$ | 0.43 | 2D |
| InS | 2.09 | 2D n-type | InP | 1.35 | 3D | SbOx | 0-2.8 | 2D |
| InSe | 1.26 | 2D n-type | InAs | 0.36 | 3D | $Sb_2S_3$ | 1.8 | 2D |
| InTe | 0.6 | 2D | InSb | 0.17 | 3D | $Sb_2Se_3$ | 1.17 | 2D |
| $Ga_2S_3$ | 3.05 | 2D | $Al_xGa_{1-x}As$ | 1.42-1.95 | x < 0.4 | $Sb_2Te_3$ | 0.45 | 2D |
| $Ga_2Se_3$ | 2.56 | 2D | InGaAs | 0.36-1.43 | 3D | $Bi_2S_3$ | 1.3 | 2D |
| $Ga_2Te_3$ | 0.95 | 2D | GaAsSb | 0.73-1.43 | 3D | $Bi_2Se_3$ | 0.3 | 2D |
| $Ga_2SeTe_3$ | 1.25 | 2D | InGaN | 2.0-3.4 | 3D | | | |
| $In_2S_3$ | 2.1 | 2D | | | | | | |
| $In_2Se_3$ | 1.45 | 2D | | | | | | |
| $In_2Te_3$ | 1.16 | 2D | | | | | | |

| IV-VI | Eg eV | Notes | II-VI | Eg eV | notes |
|---|---|---|---|---|---|
| SnS | 1.3 | 2D | CdS | 2.42 | 3D |
| SnSe | 0.95 | 2D | CdSe | 1.74 | 3D |
| PbS | 0.4 | 2D | CdTe | 1.49 | 3D |
| PbSe | 0.27 | 2D | ZnTe | 2.25 | 3D |
| $SnS_2$ | 2.23 | 2D | $Cd_xZn_{1-x}Te$ | 1.49-2.25 | 3D |
| $Pb_{0.2}Sn_{0.8}Se$ | 0.43 | 2D | | | |
| $SnS_{0.44}Se_{0.56}$ | 1.42 | 2D | | | |

| based copper | eV Eg | Notes | Other | eV Eg | Notes |
|---|---|---|---|---|---|
| CuO | 1.2 | 3D p-type | IV-III-V | | |
| $CuInS_2$ | 1.55 | 3D | $C_xB_yN_z$ | 0-6 | 2D |
| $CuInSe_2$ | 1 | 3D | V | | |
| $CuGaS_2$ | 2.49 | 3D | Black P | 0.3-1.7 | 2D |
| $CuGaSe_2$ | 1.7 | 3D | Bi | 0.8 | 2D |
| $CuGa_3Te_5$ | 1.09 | 3D | | | |
| $CuSbS_2$ | 1.5 | 2D | $FeS_2$ | 0.95 | 3D |
| $CuSbSe_2$ | 1.1 | 2D | $Zn_3P_2$ | 1.5 | 3D |
| $CuSbTe_2$ | 0.87 | 2D | | | |
| $CuBiS_2$ | 1.65 | 2D | | | |
| $CuBiSe_2$ | 1.13 | 2D | | | |
| $CuBiS_3$ | 1.875 | 2D | | | |
| $Cu_2ZnSnS_4$ | 1.49 | 3D | | | |
| $Cu_2ZnSnSe_4$ | 1 | 3D | | | |
| $Cu_{1.18}Zn_{0.4}Sb_{1.9}S_{7.2}$ | 2.2 | 3D | | | |
| $Cu_2SnS_3$ | 0.91 | 3D p-type | | | |

Forming a p-n junction in the case of 2D layered materials differs from typical 3D semiconductors like silicon or group III-V materials. In the 3D case, a junction is formed by doping a bulk or film single crystal with donor and acceptor elements. A relatively large intermediate zone is created in the transition from n-type to p-type conductance regions because of the doping technology (implantation, diffusion etc.) and/or the epitaxial transition from one compound to another which requires a crystallographic commensuration transition zone. On the other hand, p-n junctions with 2D materials are formed by simply stacking hetero materials, forming abrupt hetero-junctions. A pair of semiconductors with a narrow type-II staggered alignment hetero-junction facilitates charge separation, which is a must for high efficiency PV cells. With staggered alignment, the two bandgaps are at offset positions, n-type is lower in energy, and p-type is relatively higher in energy. In the case of 2D layered materials, finding a p-n pair is relatively easy because the band offsets for stacked layer junctions follow Anderson's electron affinity rule, as described in Yuzheng Guo and John Robertson, Appl. Physics Letters, vol. 108, 233104, 2016. As an example, the same metal member in a compound but with heavier chalcogenide element, offsets the latter to a p-type position as compared to the n-type. For example, InSe is n-type versus InTe which is p-type. Even minor substitution of Se with Te in InSe will offset the band such that an n-p junction is attainable with the pair InSe/InSe$_{0.9}$Te$_{0.1}$.

Another PV cell alternative is a graphene/2D absorber Schottky junction. Highly p-doped Gn and n-doped Gn surround a multi-slab semiconductor. An electron blocking h-BN interlayer can be inserted between the p-Gn and the absorber to produce an effective Schottky junction. The absorber is typically n-type (i.e. InSe) and the "Schottky metal" is a graphene layer in which some of the carbon atoms in the mesh are replaced by boron atoms. Also, other means of doping can be performed with nitric acid ($HNO_3$).

Exemplary Material Layers

In FIG. 4(d), solar device 210 has a stack of four PV cells, each with two electrodes and a p-n junction. The electrically insulating transparent layers 105 separating adjacent PV cells and the encapsulation layer 105E are preferably made of h-BN. The electrodes of the PV cells are preferably made of Gn.

The four PV cells, 202, 204, 206, and 208, preferential absorb solar radiation photons in the blue, green, red, and infrared spectral bands, respectively.

PV cell 202, which is the first to receive solar radiation, is preferably comprised of an n-p junction with a bandgap width of about 2.0 eV, which is designed to supply an open circuit voltage (Voc) of about 1.6 V. In this case, absorbing n-layer 202n may be comprised of $In_2S_3$ (Eg=2.1 eV) and absorbing p-layer 202p may be comprised of $In_2(Se_xS_{1-x})_3$.

PV cell 204 is preferably comprised of an n-p junction with a bandgap width of about 1.6 eV, which is designed to supply a Voc of about 1.2 V. In this case, absorbing n-layer 204n may be comprised of $Sb_2S_3$ (Eg=1.63 eV) and absorbing p-layer 204p may be comprised of $Sb_2(Se_xS_{1-x})_3$.

PV cell 206 is preferably comprised of an n-p junction with a bandgap width of about 1.2 eV, which is designed to supply a Voc of about 0.8 V. In this case, absorbing n-layer 206n may be comprised of $Bi_2S_3$ (Eg=1.3 eV) and absorbing p-layer 206p may be comprised of $Sb_2Se_xS_{3-x}$.

PV cell 208 is preferably comprised of an n-p junction with a bandgap width of about 0.8 eV, which is designed to supply a Voc of about 0.4 V. In this case, absorbing n-layer 206n may be comprised of $Pb_xSn_{1-x}Se$ (Eg=0.85 eV) and absorbing layer 206p may be comprised of $Pb_ySn_{1-y}Se$, where y is greater than x.

Conducting vias 202v, 204v, 206v, and 208v, which draw the diode output voltages to the pads at the underside of encapsulation layer 105E, are preferably made of copper.

Method of Fabrication

FIG. 5 is a block diagram showing the steps of an exemplary manufacturing method, for producing a solar module according to the present invention.

Step 400A is to provide a module-sized bottom substrate 112. Step 400B is to deposit wiring circuitry 111 onto bottom substrate 112.

Step 400C is to provide a vapor deposition system which enables atomic layer deposition (ALD) and low pressure chemical vapor deposition (LPCVD). The system typically includes a cluster tool having a load-lock device, an ALD chamber, and a LPCVD chamber, all connected in a vacuum system for controlled atmosphere; or alternatively, an integrated ALD/LPCVD tool in which ALD and LPCVD functions are performed in one chamber.

To enable LPCVD, the ALD/LPCVD chamber should have an additional heating source in order to reach the high temperatures needed for reaction and annealing. As an example, a "ceiling" radiative quartz lighting heater can be used. Moreover, such a heater can expand the ALD process "window" by rapidly changing temperature between single reactions. The ALD/LPCVD chamber can include light sources such as LEDs, or lasers; a remote plasma module. Light sources can induce photochemical reactions and gas species activation. Remote plasma can supply reactive species (radicals) that can lower the temperature and thermal budget for growing the films. The ALD mode is designed to epitaxially grow thin layers of transparent conductors, insulators and seed layers of semiconductors. The semiconductor layers are much thicker than the other layers, and since the ALD process is rather slow, LPCVD is used to rapidly epitaxially grow the body of the semiconductors. Another accessory in the ALD chamber is a bellow shaft extending from the roof of the ALD chamber. An electromagnet attached to the tip of the bellow shaft facilitates mask manipulation for the via processing. Another accessory to facilitate mask manipulation is a rotating heater table for the template wafer.

Step 400D is to provide a crystallographic template handle wafer. Step 400E is to manufacture a wafer-sized multi-junction solar device, such as 110 or 210, including metallization for conducting electrodes and vias. Step 400F is to connect the solar device to wiring circuitry 111 on bottom substrate 112, and to remove the wafer handle. Step 400G is to repeat steps 400D-F to make a plurality of solar devices. Finally, step 400H is to manufacture and attach a top laminate 101 over the plurality of solar devices to form a solar module.

Step 400E is further split into the following sequence of sub-steps:
i) ALD/LPCVD to form a first PV cell, further comprising the steps of:
   a. ALD of a first transparent electrode,
   b. placing a shutter having a first shape (i.e. cylindrical) on a small portion of the first transparent electrode,
   c. ALD of a seed layer of p-n junction,
   d. LPCVD of a p-n junction,
   e. ALD of a second transparent electrode,
   f. placing a shutter having a first shape on a small portion of the second transparent electrode, and
   g. ALD of an electrical isolation layer;
ii) Repeating step i) to form a second PV cell;
iii) Exchanging shutters having a first shape to shutters having a second shape (i.e. conical) which is smaller than the first shape;
iv) ALD of a bottom encapsulation layer including sleeves for vias;
v) Removing shutters;
vi) Removing handle wafer with its overgrown layers from the ALD/LPCVD tool
vii) Physical masking to determine electrical pad sites corresponding to via locations
viii) Metallizing vias and pads using Physical Vapor Deposition (PVD)

FIGS. 6(a)-(x) are a series of schematic diagrams illustrating the fabrication process 600, for making solar device 110, described in FIGS. 3(a)-(d). These diagrams may readily be extended to fabricate the more complex solar device 210, described in FIGS. 4(a)-(d).

Fabrication process 600 begins by introducing a crystalline wafer into an ALD chamber. PV cell 102 is grown first, followed by electrically insulating transparent layer 105, PV cell 108, and encapsulation layer 105E. Without opening the ALD chamber, epitaxial layers are grown continuously, with intermediate placement of masks on Gn electrodes for vias. In one of the last steps (shown in FIG. 6(v)), the wafer with the overgrown films is connected to the wiring circuitry 111 on bottom substrate 112 of solar module 100. Before attaching top laminate 101, the template wafer is removed and remounted on the ALD chamber for one more run.

The reference numbers used in FIGS. 6(a)-(x) differ from those used in FIGS. 2-4, in order to avoid possible confusion between similar elements having slightly different shape representations.

In FIG. 6(a), a mono-crystalline wafer 602 is placed in the ALD chamber to serve as a recyclable handle template for MJSD films. The wafer can be essentially of any single crystalline surface, or epitaxially overgrown by a material selected from a group that can withstand process temperatures of up to about 600° C. The list can include but is not limited to Pyrolithic Graphite, Mica, $CaF_2(111)$, Si(111), Si(110), Si(100), SiC, Ge(111), Ge(110), GaAs(111), GaAs (100), $Al_2O_3$, TaC(111), TaC(001), TiC(111), ZrC, HfC, NbC(111), Ni(111), Ni(001), Pt(111). To become a substrate for h-BN layer which initiate the MJSD stack, the wafer should acquire a flat and dangling bond free surface. While Graphite and Mica are naturally such 2D dangling bond free substrates, such that van der Waals (vdW) epitaxial 2D/2D crystals can grow, 3D wafers have to be amended for Quasi van-der-Waals (QvdW) epitaxy. In QvdW epitaxy, a 2D crystal is grown over a 3D crystal, in which the surface of the 3D wafers have immobilized radicals or dangling bonds which must be saturated. That can be achieved by surface treatment or thin film 604 that can include hydrogenation (Ge:H), fluorination, sulfuration, nitridation, phosphidation, arsenidation, antimonidation, platination and graphenation etc. Before loading the wafer on the ALD tool, an oxide or other contaminants are removed as known in the art. Argon plasma cleaning can be performed prior to growth in the ALD chamber accessed with the plasma module.

In FIG. 6(b), an encapsulation 2D crystalline layer 303 can be grown. Its function is to secure the Gn electrode that follows, as it will be exposed to ambient atmosphere after completing multi-junction solar device stack. The preferred material is h-BN. The ALD precursors for h-BN can be but are not restricted to Tris(ethylmethylaminoborane (TEMAB, C9H24BN3) used as a precursor for the h-BN synthesis with a co-reactant of $NH_3$ plasma at 250-300° C., as described in Park, H. et al. "Large-scale synthesis of uniform hexagonal boron nitride films by plasma-enhanced atomic layer deposition". Sci. Rep. 7, 40091; doi: 10.1038/srep40091 (2017). Also, BN can be deposited by $BBr_3$ and $NH_3$, as described in *ACS Appied. Mater. Interfaces,* 2017, vol. 9 (19), pp 16669-16678; and $BCl_3$ and $NH_3$ as described in Langmuir, 2016, vol. 32, 2601-2607. Other precursors for BN are ammonia-borane, $NH_3$—$BH_3$, Borazine, $B_3H_6N_3$ and Diborane $B_2H_6$ and ammonia; Borazene ($H_{2B}$—$NH_2$); Trichloroborazine, $Cl_3B_3N_3H_3$; $B_{10}H_{14}/NH_3$, trimethylborate, $B(OMe)_3$ and others.

In FIG. 6(c), an n-doped graphene layer 311 is grown on h-BN layer 303. A wealth of graphene precursors are available, such as any organic substance including alkanes, alkenes, aryls, acetylene, formic acid, benzene, hexane, oils, polymers and the like. Plasma enhanced ALD for growing graphene at 400° C. using benzene and $H_2$ plasma as the first and second reactants respectively, as described in *J. Mater. Chem.* C, 2014, vol. 2, 7570. Another precursor can be acetylene. To add doping nitrogen to the graphitic honeycomb, ammonia, hydrazine, nitrogen or ammonia plasmas, amines e.g. methylamine can be used.

In FIG. 6(d), a physical mask 606 is placed on Gn layer 311 to expose electrical contact to cathode 311. The mask does not allow any more deposition at that place. The mask material can be any ceramic material, graphite, boron nitride, stainless steel or other which does not react or dope the different materials of the device. The mask is a coin-shaped magnetic material encapsulated in a ceramic material, with diameter ranging from 1 mm to 30 mm, depending on the wafer size. The mask is positioned on the wafer without opening the ALD chamber.

In FIG. 6(e), n-type photoactive absorber 312 is grown on Gn surface. Any of the materials with adequate bandgap of table 1 can be used as n-type material. Each material is a compound of a cation of metals Ga, In of group 13 or a metalloids As, Sb or Bi of group 15 with an chalcogenide anion like S, Se or Te of group 16. The sequence of deposition is the following: In III-VI materials the order in a single slab is X/M/M/X where M is a metal or metalloid and X is a chalcogenide; for example, InSe is actually $In_2Se_2$ slab and is built of four layers: Se/In/In/Se. $M_2X_3$ materials include five layers: X/M/X/M/X. The ALD precursors may be but are not limited to:

For Ga and In: Metal alkyl like trimethyl gallium, $Ga(CH_3)_3$; amide ligands like hexakis(dimethylamido) digallium $(Ga_2(NMe_2)_6$; beta diketonate compounds like indium acetylacetonate; halide compounds like $InCl_3$; NN'diisopropylacetamidinate (InIII). Halide compounds facilitate higher temperature growth which promotes better crystallinity.

For Arsenic: Arsine gas $AsH_3$; Alkyl $(CH_3)_3$; aryl, $AsPh_3$; tert-butylimino arsinic.

For Antimony: halides, SbCl3; amino, tris(dimethylamido)antimony, $Sb(N(CH_3)_2)_3$; alkyl, (CH3)3Sb.

For the chalcogenides: elemental, S, Se; hydride, $H_2S$, $H_2Se$; alkyl, diisopropyl tellurium, $Te(C_3H_7)_2$; aryl, $SPh_2$; silyl hydride $Se(SiH_3)_2$; silyl alkyl: (Si $Me_3)_2Se$, $(SiEt_3)_2Se$, (Si $Me_3)_2Te$, $(SiEt_3)_2Te$ etc. For better crystallinity, higher temperatures are preferred and are promoted by smaller precursor molecules.

Returning to FIG. 6(e), an epitaxial seed layer of about one nm is grown by ALD mode and thereafter switch to LPCVD mode for executing the bulk of the layer. n-type absorber 312 is $As_2Se_3$ with an Eg of 1.78 eV. The sequence of ALD layers for one slab is Se/As/Se/As/Se. $SeH_2$ gas is introduced to the chamber at wafer temperatures of about 350° C. After $N_2$ purging, $AsH_3$ gas is introduced and reacts with absorbed Se, releasing $H_2$ gas. $N_2$ purging is allowing repeating the cycle depositing Se layer, As layer and eventually last selenium layer, getting the $As_2Se_3$. This process of acquiring one $As_2Se_3$ slab layer can be repeated 5 to 300 times to get the desired number of slabs. To save time, only the first slab of $As_2Se_3$ is grown by ALD mode while the full thickness is achieved by the LPCVD mode in the chamber or in a cluster tool attached to the ALD tool.

In FIG. 6(f) p-type absorber 313 is grown on 312 $As_2Se_3$ slab layer. To get the Eg of 1.7 eV and type II bands alignment (for p-n junction), the same $As_2Se_3$ slab layer is doped with Te: $As_2(Te_xSe_{1-x})_3$. The growth details are akin to FIG. 6(e) except for mixing of $SeH_2$ gas with $TeH_2$ gas ($H_2Te$ gas was produced by reaction of Al2Te3 and HCl) before introducing to the ALD chamber. It is noted that mixing can be executed to one, two or three of the selenium sheets. Also, the total number of $As_2(Te_xSe_{1-x})_3$ slab layers can be different from the number of $As_2Se_3$ layers.

In FIG. 6(g), a graphene monolayer 314 is ALD grown on the $As_2(Te_xSe_{1-x})_3$ absorber after returning to the ALD mode. Gn layer can be p-doped with boron acceptor atoms. That can be executed by adding $B_2H_6$ (di-borane), Borane or $BCl_3$ to the graphene precursor.

In FIG. 6(h), mask 608 is positioned, to form a contact to the Gn layer of FIG. 6(g). The details are the same as in FIG. 6(d).

FIG. 6(i) shows the growth of a 2D hexagonal boron nitride layer 301 which electrically separates PV cells 310 and 320. The h-BN layer is produced in the ALD chamber using boron/nitrogen precursors, with plasma as in FIG. 6(b).

FIG. 6(j) shows the production of graphene anode 321 in PV cell 320, which is similar to the production of anode 314 in FIG. 6(g). In FIG. 6(k), mask 610 is introduced to expose the contact to anode 321 of FIG. 6(j), much as in FIG. 6(d).

FIG. 6(l) shows the ALD/LPCVD growth of p-type photoactive infrared absorber 322 (Eg=1.0 eV) of PV cell 320, which can be $In_2Te_3$. This 2D layer is in essence a (Te—In—Te—In—Te) slab repeating itself 50-200 times. The precursor of Te can be $TeH_2$; the indium precursor can be trimethyl indium, $In(CH_3)_3$; halide compounds like $InCl_3$. $Te_3$ seed layer is grown by ALD mode; continued growth uses LPCVD mode.

Figure 6:
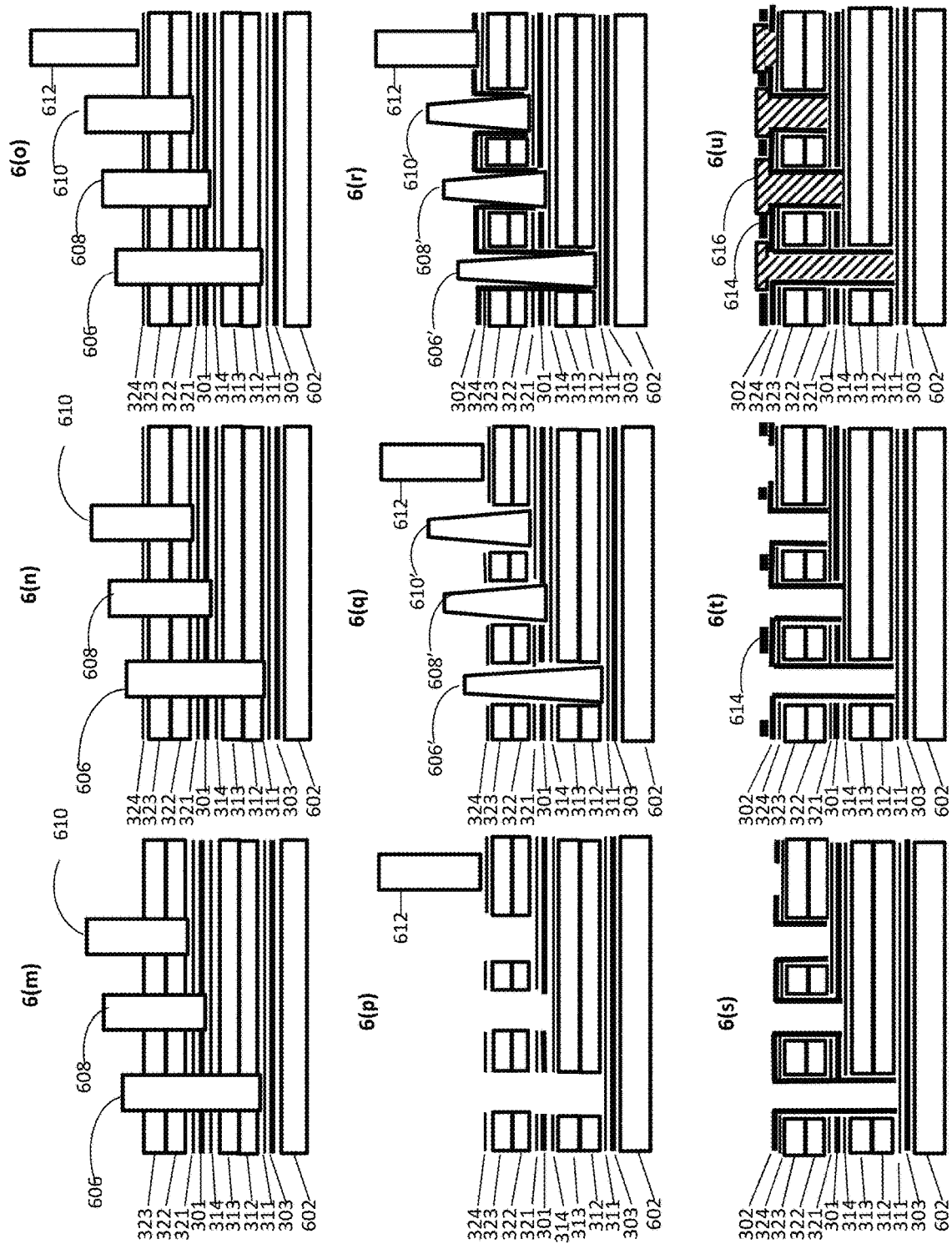
FIGS. 6(a)-(x) are a series of schematic diagrams illustrating the steps of the exemplary manufacturing method of FIG. 5.
Figure 6:
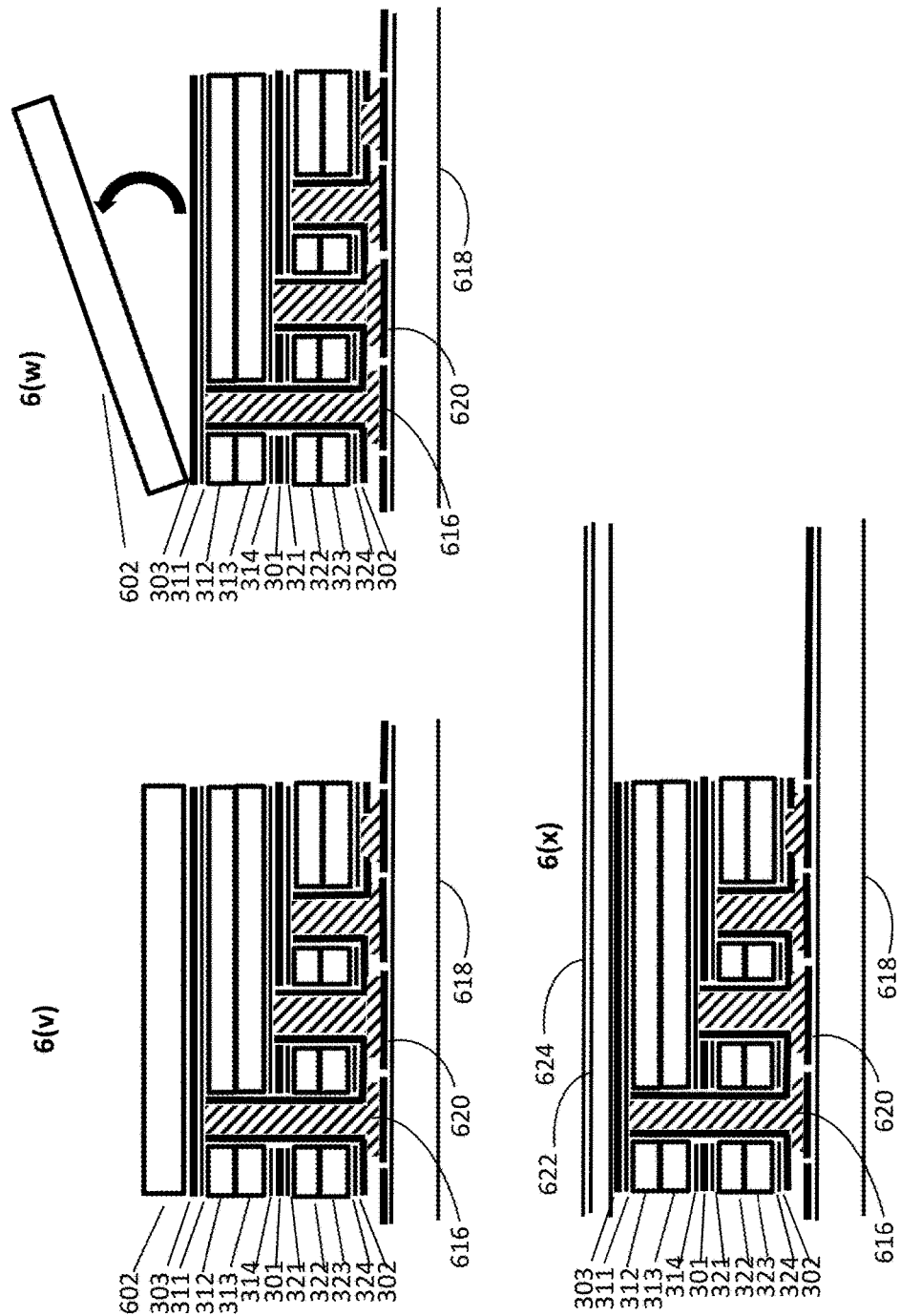

FIG. 6(m) shows the counterpart n-type absorber 323 of PV cell junction 120 fabricated with LPCVD mode for the bulk. Here $InTe_{1-x}Se_x$ can be the absorbing material that should bear an Eg of 0.9 eV. This 2D absorber is built of 50-200 slabs of $In(Te_{1-x}Se_x)$ where two indium layers are sandwiched between two $Te_{1-x}Se_x$ monolayers: ($Te_{1-x}Se_x$—In—In—$Te_{1-x}Se_x$). The substitution (x) of some of the Se with Se can be done at both sandwiching layers or with one of them for example (Te—In—In—$Se_xTe_{1-x}$). Firstly, the chalcogenide Te layer can be deposited. Tellurium and selenium precursors are the same as in FIG. 6(f). Thenafter, two indium layers are deposited as Indium precursors can be the same as in FIG. 6(*l*). Lastly, a Te$_{1-x}$Se$_x$ layer is deposited to finish the slab. Alternatively, if Se substitution (x) in Te$_{1-x}$Se$_x$ is to be grown in all slabs, the whole growth can be done with fast LPCVD mode.

FIG. 6(*n*) shows the growth of a graphene layer 324 as the cathode of PV cell 320. An N-doped graphene is grown on the surface of an n-type absorber InTe$_{1-x}$Se$_x$. The details are just like in FIG. 6(*c*).

In FIG. 6(*o*), mask 612 is placed to expose the contact to cathode 324 of FIG. 6(*n*), with details the same as in FIG. 6(*d*). In FIG. 6(*p*), masks 606, 608 and 610 are removed, to make place for new masks of FIG. 6(*q*) that will replace them. To release the masks from the films that cover them, a simple bushing can be used to counter the pull-out by the electromagnetic shaft.

In FIG. 6(*q*), new masks 606', 608' and 610' are placed in the leftover holes of masks 606, 608 and 610. The masks 606', 608', 610' have the form of a cone or a poppet valve (also called a mushroom valve). The idea is to permit h-BN layer of FIG. 6(*r*) to conformally coat the vertical surfaces of leftover holes of masks 606, 608 and 610 but not the bottom (horizontal area) of these holes. Only the target contact to the electrode (anode or cathode) is to be exposed for further padding while the vertical walls are electrically insulated. ALD method is known for its conformal coverage ability; and thus, with smaller diameter of the mask (except the bottom, relative to the original one), h-BN layer will coat and isolate the inner vertical surfaces of the holes.

In FIG. 6(*r*), an h-BN layer 302 is grown on the graphene electrode 324 to seal the device and to serve as a dielectric for insulating vertical surfaces of leftover holes in FIG. 6(*p*) forming the insulating sleeves for the conducting vias. The h-BN layer is essentially the same as layer 303 of FIG. 6(*b*).

In FIG. 6(*s*), all masks are removed, the chamber is opened, and the overgrown wafer is released.

In step 6(*t*), a physical shadow mask 614 is placed around the leftover holes in FIG. 6(*s*), which exposes the holes and an adjacent area for metallization pads.

In FIG. 6(*u*), a metal alloy such as Cu/Ag layer 616 is grown that penetrate to the vias and contact to the exposed Gn electrodes at the bottom. An area surrounding the hole on the solar device surface is grown too through mask 614, forming contacting pads for the next inter-device connections. After growth, mask 614 is removed.

In FIG. 6(*v*), a permanent bottom substrate 618 for the freed and overturned solar device is prepared. The substrate can be prepared in advance with metal circuit tracks 620 such that pads 616 of the device will fit to the metal lines and integrate with sister devices. Substrate 618 should be dielectric but is not limited to polymer film or glass article; it can be transparent, opaque or reflecting. A reflecting substrate can serve as a mirror to back reflect photons that were not absorbed on a first pass through the PV cells, so as to provide another opportunity for their absorption. The mirror material can be aluminum, copper, silver, gold, titanium nitride, zirconium nitride or alloys of those reflectors.

In FIG. 6(*w*), the overgrown wafer 602 with its h-BN surface and exposed 616 pads is coupled to substrate 618. Pads 616 fit metal circuits 620 of substrate 618 and soldered. After soldering, the solid template wafer 602 is peeled from the solar device and is placed back in the ALD chamber for reutilization. It is noted that if wafer 602 is over grown on both of its sides, the peeled wafer with its second overgrown side is introduced to a second permanent wafer 618 and one more solar device is formed.

In FIG. 6(*x*), a top laminate 622 is produced by placing a glass or polymer film on the plurality of solar devices. The polymer can be sprayed silicone, polycarbonate sheet or other polymer that is transparent and durable. A micropyramidal surface and antireflective coatings are be incorporated in top laminate 622. It is noted that in this invention there are no metal lines on top of the solar devices that might block the penetration and absorption of solar radiation.

It will be appreciated that the above descriptions are intended only to serve as examples, and that many other embodiments are possible within the scope of the present invention as defined in the appended claims.

The invention claimed is:

1. A voltage-matched solar module for converting incident solar radiation into electricity, comprising successively:
    a plurality of wafer-sized multi-junction solar devices, each solar device comprising a first photovoltaic (PV) cell, which first receives said incident solar radiation, an electrically insulating transparent layer,
        a second PV cell, which receives incident solar radiation after said first PV cell, and
        an encapsulation layer;
    and wiring circuitry mounted on a protective module-sized bottom substrate;
wherein
    said first and second PV cells each comprise two transparent electrodes and a p-n junction,
    said first and second PV cells of said solar device are aligned so as to fully overlap and are electrically connected by conducting vias to respective first and second circuits of said wiring circuitry,
    said first circuit further comprising a multiplicity of serial strings of first PV cells, the strings being electrically connected in parallel,
    said second circuit further comprising a single serial string of second PV cells, and
    said first and second circuits of said wiring circuitry have a substantially same voltage and are connected in parallel, and
wherein
    the p-n junctions form a type II band alignment, have a direct bandgap transition, and comprise a 2D layered or non-layered semiconducting material selected from a group comprising elements of chemical groups V and VI, compounds of chemical groups I-II-IV-VI, I-II-V-VI, I-III-VI, I-IV-VI, I-V-VI, I-VI, II-V, II-VI, III-V, III-VI, IV-VI, V-VI, FeS$_2$ and perovskites.

2. The solar module of claim 1 wherein each solar device comprises a monolithic stack of thin films comprising at least one two-dimensional (2D) material having a polycrystalline or monocrystalline structure and serving as a semiconductor, conductor or insulator.

3. The solar module of claim 2 wherein said thin films are held together by van der Waals forces.

4. The solar module of claim 2 wherein said 2D materials are layered or non-layered crystalline films.

5. The solar module of claim 1 wherein said first and second PV cells absorb solar radiation of short and long wavelength respectively, and a bandgap of the p-n junction of the first PV cell is wider than a bandgap of the p-n junction of the second PV cell.

6. The solar module of claim 1 wherein said electrodes are comprised of 2D layered conductors selected from a group consisting of graphene, metal halogenides, metal chalcogenides, metal oxides and metal pnictogenides.

7. The solar module of claim 1 wherein each of the conducting vias is enclosed within an insulating sleeve and terminates with a pad on said wiring circuitry.

8. The solar module of claim 7 wherein said electrically insulating transparent layer and/or said insulating sleeve comprise a 2D material selected from a group comprising hexagonal boron nitride and metalloids and metals of halogenides, oxides, nitrides, and oxynitrides.

9. The solar module of claim 1 wherein said module-sized bottom substrate is a flexible or solid sheet which shields the solar module from its surroundings and on which a metal film is deposited or printed so as to form said wiring circuitry and to reflect incident solar radiation, and wherein the bottom substrate comprises a material selected from a group comprising plastic, glass, composites and stainless steel coated by a dielectric film.

10. The solar module of claim 1 further comprising a module-sized top laminate which shields the solar module from its surroundings, and which is comprised of a transparent plastic or glass, anti-reflecting coatings and micron-scale pyramids.

\* \* \* \* \*